(12) United States Patent
Burgers (10) Patent No.: US 6,573,445 B1
(45) Date of Patent: Jun. 3, 2003

(54) METHOD FOR MANUFACTURING A METALLIZATION PATTERN ON A PHOTOVOLTAIC CELL

(75) Inventor: Antonius R. Burgers, Schagerbrug (NL)

(73) Assignee: Stichting Energieonderzoek Centrum Nederland, Petten (NL)

( * ) Notice: Subject to any disclaimer, the term of this patent is extended or adjusted under 35 U.S.C. 154(b) by 0 days.

(21) Appl. No.: 09/856,557

(22) PCT Filed: Nov. 17, 1999

(86) PCT No.: PCT/NL99/00708

§ 371 (c)(1),
(2), (4) Date: Aug. 9, 2001

(87) PCT Pub. No.: WO00/31803

PCT Pub. Date: Jun. 2, 2000

(30) Foreign Application Priority Data

Nov. 23, 1998 (NL) .............................................. 1010635

(51) Int. Cl.[7] .......................................... H01L 31/0224

(52) U.S. Cl. ......................... 136/256; 136/244; 438/98; 257/457; 257/459; 257/431

(58) Field of Search ............................... 136/256, 244; 438/98; 257/457, 459, 431

(56) References Cited

FOREIGN PATENT DOCUMENTS

WO      WO 89/05521      6/1989

OTHER PUBLICATIONS

DeSalvo et al, "An Optimized Top Contact Design for Solar Cell Concentrators," 18th IEEE Photovoltaic Specialists Conference, pp. 435–440, Oct. 21–25, 1985.*
Nubile et al, "A Contribution to the Optimization of Front-Contact Grid Patterns for Solar Cells," Solid-State Electronics, 37(1), pp. 220–222 (Jan. 1994).*
Burgers et al, "Optimizing Metalization Patterns for Yearly Yield," 26th IEEE Photovoltaic Specialists Conference, pp. 219–222, (Sep. 30–Oct. 3, 1997).*
Burgers et al, "Metallisation Patterns for Interconnection through Holes," Solar Energy Materials & Solar Cells, 65, pp. 347–353 (2001).*
Jenkins P. et al.: "Increased Efficiency with Surface Texturing in ITO/INP Solar Cells", Proceedings of the International Conference on Indium Phosphide and Related Materials, Newport, Apr. 21–24, 1992, No. Conf. 4, pp. 186–189.
Copy of International Search Report, for PCT/NL99/00708, dated Feb. 24, 2002.
Patent Abstracts of Japan, abstract for JP 6–53531, Feb. 25, 1994.

* cited by examiner

*Primary Examiner*—Alan Diamond
(74) *Attorney, Agent, or Firm*—Michael D. Bednarek; Shaw Pittman LLP (57) ABSTRACT

Method for applying a metallization in accordance with a pattern of a system of mutually connected electrical conductors for transporting electrical charge carriers on at least one of the outer surfaces of a photovoltaic element, wherein the conductors display a determined series resistance and cover a part of the at least one surface in accordance a determined degree of covering, which method comprises the steps of (i) providing said photovoltaic element, at least one of the outer surfaces of which is adapted for applying of a metallization thereto, and (ii) applying a metallization in accordance with a determined pattern on the relevant surface, wherein the metallization, is applied in the second step (ii) in accordance with an optimized pattern, the geometry of which is defined such that the electrical power of this element is maximal as a function of this geometry, and photovoltaic element provided with a metallization applied according to this method.

6 Claims, 8 Drawing Sheets

METHOD FOR MANUFACTURING A METALLIZATION PATTERN ON A PHOTOVOLTAIC CELL

The invention relates to a method for applying a metallization in accordance with a pattern of a system of mutually connected electrical conductors for transporting electrical charge carriers on at least one of the outer surfaces of a photovoltaic element, wherein the conductors display a determined series resistance and cover a determined fraction of at least the one surface, which method comprises the steps of (i) providing said photovoltaic element, at least one of the outer surfaces of which is adapted for applying of a metallization thereto, and (ii) applying a metallization in accordance with a determined pattern on the relevant surface.

A photovoltaic element (solar cell) generally comprises a stacked structure of at least one layer of semiconductor material of the p-type and a layer of semiconductor material of the n-type for generating electrical charge carriers under the influence of photons incident on the interface of these layers; a pattern of a system of mutually connected conductors, hereinafter referred to as metallization pattern, forms an essential part of such an element. A metallization pattern is usually applied to the front and rear surface of a solar cell, for instance using screen-printing techniques, in order to make electrical contacts with this cell. Applied metallization is usually non-transparent and causes shadow losses in a solar cell on the side receiving the sunlight (further designated as front side).

The design of a metallization pattern applied by means of screen-printing to the front side of a solar cell is generally the result of a compromise between shadow losses caused by this metallization and the electrical series resistance of the metallization pattern: the lower the resistance, the greater the total surface area of the pattern and the shadow losses caused thereby. On the rear side of a solar cell shadow losses generally do not represent a problem, completely covering the rear side with a metallization layer is however not strictly necessary for proper functioning of a solar cell, while the production costs of such a full layer are generally higher than those of a metallization pattern which does not completely cover the rear side.

A metallization pattern usually comprises a web of thin lines, referred to as fingers. These lines have to be thin so that they can be arranged close to each other in order to thus reduce losses resulting from the resistance in the material of the photovoltaic element (the emitter resistance). The fingers themselves generally have insufficient electrical conductivity to conduct a photo current to the edge of the photovoltaic element without considerable losses. In order to reduce losses in the fingers, contact strips, so-called tabs, are usually arranged over the fingers which increase the total conductivity and also serve to connect a solar cell to another solar cell.

A web of fingers can in principle have any topology and dimensions, so that it is particularly difficult to find a generally optimal pattern. Optimizing of a metallization pattern therefore generally takes place for a group of patterns within a determined topology.

In Solid-State Electronics 37 (1994) Jan. No. 1. p. 220–222, a method has been developed which permits optimum grid-line patterns to be determined based on the calculation of a single parameter, the carrier mean path. The solar cell with the minimum value of this parameter has the most effective grid pattern. The method is specially indicated in the case of comparing solar cells with grid patterns of different shapes and the same shadowing factor and total grid-line lengths.

It is a drawback of this known method that the direction of the fingers is fixed by the choice of the peculiar pattern and is not chosen optimally. Another drawback of the known optimization method is that it is limited to solar cells with a particular, generally rectangular geometry.

From JP-A-06053531, i.e. the corresponding Patent Abstract of Japan, it is known to enhance the photoelectric conversion efficiency of a photoelectric converter by suppressing Joule heat and optical loss, by providing a solar cell in which subelectrodes are thinnest at a part remotest from a main electrode and become thicker toward this main electrode.

The object of the invention is to provide a method for applying a metallization pattern optimized for resistance losses and shadow losses, irrespective of the geometry of the relevant photovoltaic element.

This object is achieved, and other advantages gained, with a method of the type stated in the preamble, wherein according to the invention the metallization is applied in the second step (ii) in accordance with an optimized pattern, the geometry of which is defined such that the electrical power of this element is maximal as a function of this geometry.

The invention is based on the surprising insight that it is possible to express a known metallization pattern of a system of mutually connected electrical conductors on a solar cell in an at least partially transparent metallization which completely covers this solar cell, wherein the same shadow and resistance losses occur as in this known metallization pattern.

It has now been found that it is conversely possible to construct a system of mutually connected electrical conductors from an at least partially transparent metallization which completely covers a solar cell, wherein the same shadow and resistance losses occur as in this at least partially transparent metallization.

In an embodiment of the method according to the invention the optimized pattern for the purpose of applying a metallization pattern causing shadow and resistance losses on a front surface of the photovoltaic element adapted to receive incident light is obtained by determining the thickness as a function of the location, and therefore determining the progression of the thickness, on said front surface of a light-transmitting metallization layer which completely covers this front surface and allows through a fraction of a quantity of incident light corresponding with said degree of covering, in a manner such that the sum of the shadow and resistance losses which would occur in this element in operative state is minimal and deriving from this thickness as a function of location the geometry of a pattern of a system of mutually connected non-light-transmitting electrical conductors.

In another embodiment of the method according to the invention the optimized pattern for the purpose of applying a metallization pattern causing resistance losses on a rear surface of the photovoltaic element lying opposite a front surface adapted to receive incident light is obtained by determining the thickness as a function of the location on said rear surface of a light-transmitting metallization layer which completely covers this rear surface and allows through a fraction of a quantity of incident light corresponding with said degree of covering in a manner such that the sum of the resistance losses and a measure expressed in loss of efficiency for the quantity of material for the metallization which would occur in this element in operative state is minimal, and deriving from this thickness as a function of the location the geometry of a pattern of a system of mutually connected non-light-transmitting electrical conductors.

In an embodiment of a method according to the invention the thickness as a function of the location of the respective metallization layer is generally determined for a case in which the metallization layer which would completely cover the respective surface has an isotropic electrical conductivity.

In a particular case, for instance when optimizing a metallization pattern with a pattern of lines which conducts the electrical current generated in the relevant solar cell in a determined direction, the thickness as a function of the location of the respective metallization is determined for a case in which the metallization layer which would completely cover the respective surface has an anisotropic electrical conductivity.

In a following embodiment of the method the optimized pattern is obtained by determining the thickness of the respective light-transmitting metallization layer as a function of the location on the respective surface, in a manner such that the electrical power of this element is also maximal as a function of the electrical resistance in the transition between the surface of the element and the metallization.

In yet another embodiment the optimized pattern is obtained by determining the thickness of the respective light-transmitting metallization layer as a function of the location on the respective surface, in a manner such that the electrical power of this element is also maximal as a function of the surface resistance of the element.

In yet another following embodiment the optimized pattern is obtained by determining the thickness of the respective light-transmitting metallization layer as a function of the location on the respective surface, in a manner such that the electrical power of this element is also maximal as a function of the resistivity of the material of the metallization.

Determining of the thickness of the metallization for a number of points distributed over a front surface in a manner such that the sum of the occurring shadow and resistance losses which would occur in this element in operative state in the presence of a metallization layer completely covering this front surface is minimal, is for instance performed as follows.

If in a point represented by coordinates (x, y), on the surface of the front side of a photovoltaic element the local current density and the voltage at the maximum power generated by this element are represented by respectively $J_{mp}$ and $V_{mp}$, the total generated power $P_g$ in the absence of shadow losses caused by a metallization layer is then given by the equation $$P_g = \int_S J_{mp} V_{mp} dx dy \tag{1}$$

in which S is the surface of the element.

The maximum power represented by equation (1) is in practice lower as a result of the occurring shadow and resistance losses. On the front side of the element the current density is reduced as a result of shadow effects caused by the necessarily present metallization:

$$J'_{mp}(x,y) = J_{mp}(1 - p_s(x,y)) \tag{2}$$

in which $p_s(x,y)$ represents the shadow fraction which is given by $$p_s(x, y) = \frac{d(x, y)}{d_0} \tag{3}$$

in which d(x,y) is the thickness as a function of the location of an at least partially transparent metallization layer and do the thickness of a conductor in a system of mutually connected conductors.

From $p_s(x,y)$ a location-dependent effective surface resistance $\rho_{sm}(x,y)$ can be determined:

$$\rho_{sm}(x, y) = \frac{\rho_{sm,0}}{p_s(x, y)} \tag{4}$$

in which $\rho_{sm,0}$ is the surface resistance of the lines forming the metallization pattern.

The ohmic losses in the metallization are determined by solving a partial differential equation for the voltage distribution V(x,y):

$$\vec{\nabla} \cdot \left( \frac{1}{\rho_{sm}(x, y)} \vec{\nabla} V(x, y) \right) = -J'_{mp}(x, y) \tag{5}$$

The pattern of the electrical currents resulting from the solution of this differential equation (5) is the pattern in which the least ohmic dissipation occurs. The differential equation must be solved with boundary conditions, given by the voltage on the connection points for external contacts of the relevant solar cell.

Equation (5) enables calculation of the voltage distribution V(x,y) and the direction of the current density in the metallization, from the geometry of the solar cell, the surface resistance $\rho_{sm}(x,y)$ and the local current density $J'_{mp}(x,y)$. The power dissipated in the metallization is given by:

$$p_m = \int_S \frac{1}{\rho_{sm}(x, y)} (\vec{\nabla} V(x, y))^2 dx dy \tag{6}$$

Ohmic losses likewise occur in the transition between element surface (the emitter) and the metallization. The contact between emitter and metallization is represented by an a effective contact resistance $\rho_{ce}$ which depends on the finger width of the relevant metallization and the surface resistance under the emitter. The power dissipated as a result of the contact resistance is represented by:

$$p_c = \rho_{ce} \int_S \frac{J'_{mp}(x, y)^2}{p_s(x, y)} dx dy \tag{7}$$

in which $p_s(x,y)$ represents a reduction factor of the contact surface which is a result of partial metallization.

A further cause of ohmic losses is formed by the emitter surface resistance, $\rho_e$. It can be derived that the power $P_e$ per unit of area dissipated as a result hereof for a metallization pattern of parallel fingers with a width w is given by:

$$p_e = \int_S \frac{w^2}{12} \left( \frac{1 - p_s(x, y)}{p_s(x, y)^2} \right) \rho_e J'_{mp}(x, y)^2 dx dy \tag{8}$$

No power is of course generated in the part of the surface of a solar cell covered by the metallization pattern. The quantity of power not generated as a result of covering the solar cell surface, referred to as the shadow loss $P_s$, is represented by:

$$P_s = \int_s P_s(x,y) J_{mp} V_{mp} dx dy \quad (9)$$

Shadow losses generally play no significant part on the rear side of a solar cell. It is however important to limit the quantity of material for a metallization layer on the rear side. It can be derived that a quantity of material to be optimized can be expressed in terms of a shadow loss, as follows:

$$P_s = \int_s P_s(x,y) J_{mp} V_{mp} F_c dx dy \quad (10)$$

$F_c$ is here a dimensionless parameter which relates the quantity of material to an efficiency loss.

The total loss of power $P_t$ occurring in a solar cell can thus be expressed in terms of a shadow loss and occurring ohmic losses:

$$P_t = P_s + P_m + P_c + P_e \quad (11)$$

According to the invention an optimal location-dependent shadow fraction $p_s(x,y)$ is determined. Losses $P_c$ and $P_e$ respectively resulting from occurring contact resistance and emitter surface resistance as well as the shadow loss $P_s$ follow directly from this shadow fraction using equations (7) and (8). From the shadow fraction the surface resistance $\rho_{sm}(x,y)$ can be calculated using equation (4), and the current density $J'_{mp}$ can be calculated using equation (2). The partial differential equation (5) can be solved using the surface resistance $\rho_{sm}(x,y)$. Once this equation is solved, the ohmic losses in the metallization can be determined. The shadow fraction $p_s(x,y)$ must be chosen such that the total loss $P_t$ is minimal.

The optimization is performed as follows. A main program, written in C, addresses a subroutine written in Fortran which finds a local optimum of a continuous and differentiable function of a number of parameters which can be freely chosen. The subroutine has upper and lower limits for the parameters. The parameters are the shadow fractions $p_s(x_i, y_i)$ at a set of points $(x_i, y_i)$ to be defined by the user, designated hereinafter as coarse mesh.

The function is in this case a relatively complicated construction which calculates the total loss $P_t$ from the shadow fractions on the relevant coarse mesh. For a random point $(x, y)$, $p_s(x,y)$ is defined by means of interpolation from the values $p_s(x_i, y_i)$. The partial differential equation (5) is solved with a finite element method (FEM).

The integrands for the contact resistance loss (7), the emitter surface resistance loss (8) and the generated power are evaluated on the fine-mesh network of the finite element method, wherein for each integrand an interpolant is created which is then integrated.

Once the optimal shadow fraction $p_s(x,y)$ is determined, a translation can be performed to an equivalent metallization pattern. The orientation of the fingers is given by the field strength $\vec{\nabla} V(x,y)$. The average shadow fraction can be translated to a position-dependent finger distance $s(x,y)$:

$$s(x, y) = \frac{w}{p_s(x, y)} \quad (12)$$

It has been found that in a solar cell provided with a screen-printed metallization pattern according to the invention, the metallization losses, which amount to about 12 to 13% in a pattern according to the prior art, are reduced to about 7%.

BRIEF DESCRIPTION OF THE DRAWINGS

The invention will be elucidated hereinbelow on the basis of embodiments and with reference to the annexed drawings.

In the drawings

Figure 1:
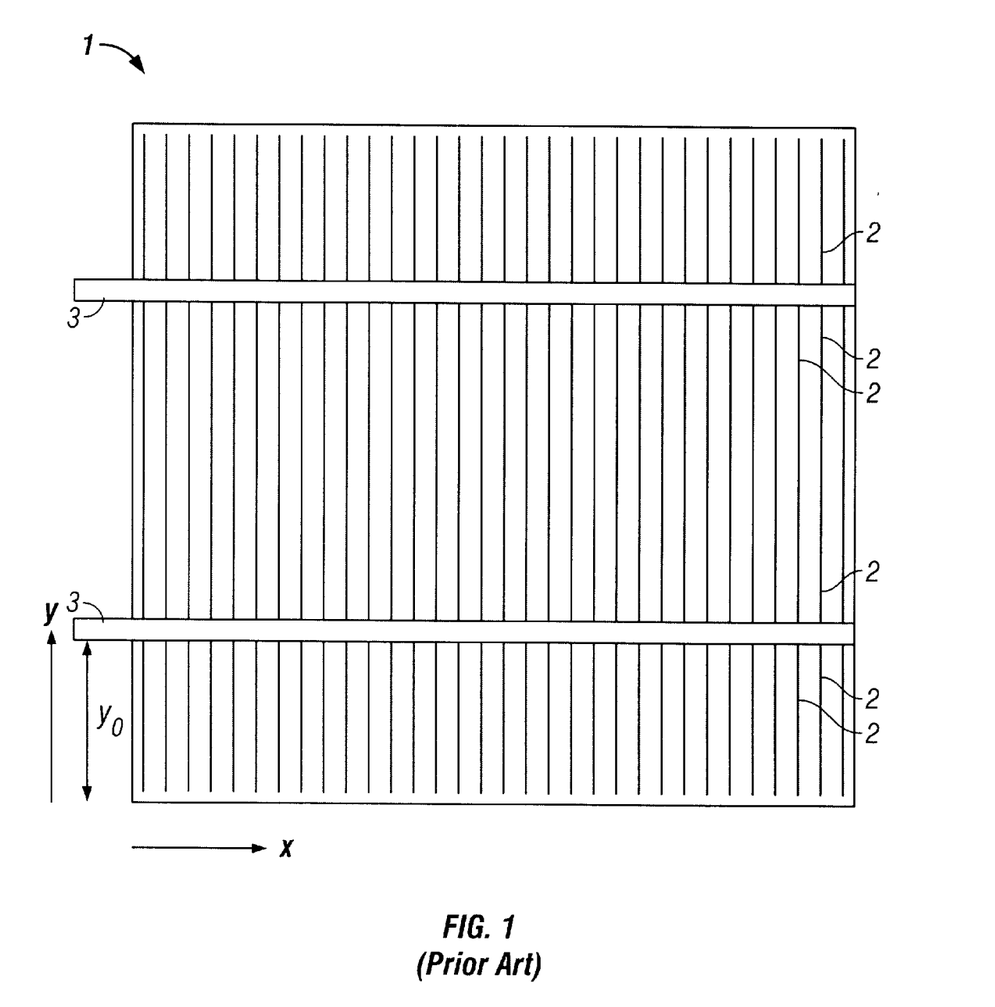
FIG. 1 shows in top view a square solar cell according to the prior art, provided with an H-shaped metallization mesh, with parallel fingers and two tabs extending transversely thereover.

FIG. 1 shows the front side, adapted to receive incident sunlight, of a square crystalline silicon solar cell 1 according to the prior art (dimensions 12.5×12.5 cm$^2$) with an H-shaped metallization pattern of parallel fingers 2 which are applied according to a known screen-printing technique and contact strips (tabs) 3, which have a higher conductivity than the fingers. Further shown is a coordinate system (x, y).

Figure 2:
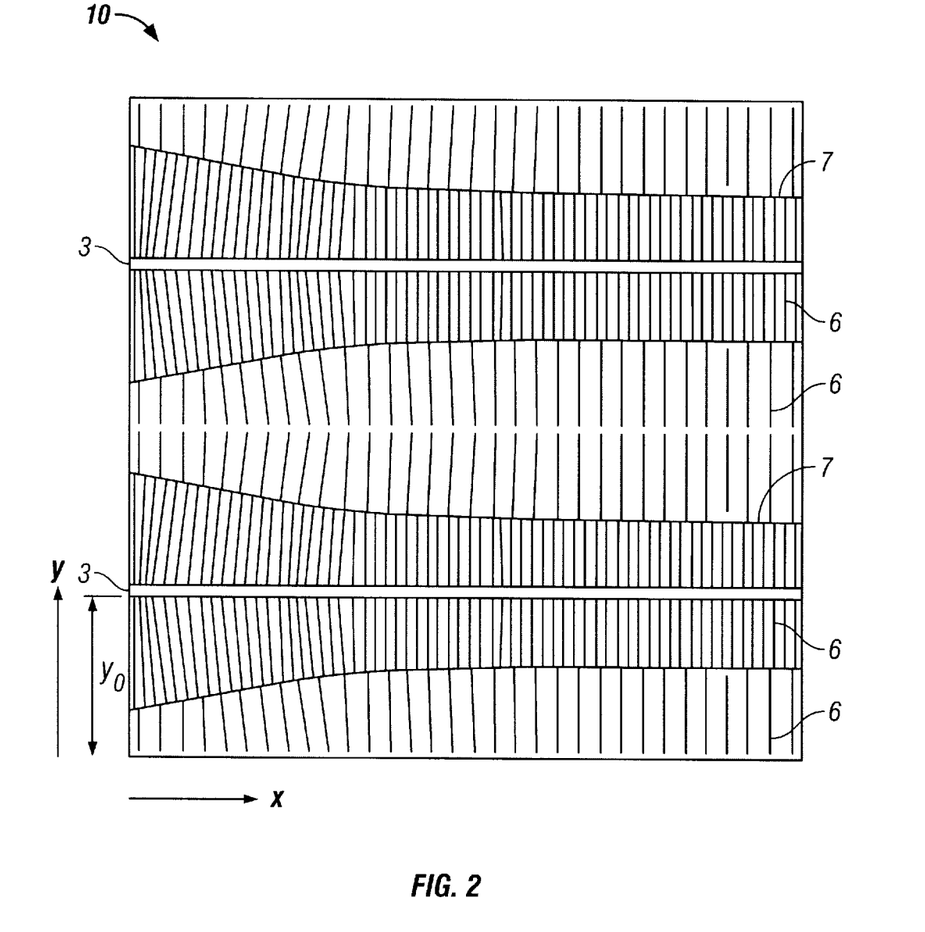
FIG. 2 shows in top view a square solar cell provided with a metallization mesh which is obtained according to a first embodiment of the method according to the invention by optimizing the H-shaped metallization mesh shown in FIG. 1.

FIG. 2 shows the front side, adapted to receive incident sunlight, of an embodiment of a square crystalline silicon solar cell 10 according to the invention (dimensions 12.5×12.5 cm$^2$), provided with tabs 3 and a metallization mesh 6, 7. The density of the fingers 6 increases in the direction of the current take-off points on the left-hand side. For the mutual contact of fingers in regions of different density use is made of connecting strips 7 which extend along paths of equivalent potential. Connecting strips 7 provide the added advantage that the adverse effect of a fracture in an individual finger 6 on the efficiency of the solar cell is reduced, since in the case of a fracture a part of finger 6 will always remain in connection with the respective tab 3. Fingers 6 are applied in a pattern which takes as starting point the pattern of solar cell 1 shown in FIG. 1 but for which according to the invention the power losses are optimized for the shadow fraction caused by the fingers.

Because the fingers in the H-shaped metallization pattern of FIG. 1 only conduct in y-direction, equation (5) must be generalized in the optimization procedure as follows, in order to enable anisotropic conductivity:

$$\frac{\delta}{\delta x}\left(\frac{1}{(\rho_x(x,y)}\frac{\delta V(x,y)}{\delta x}\right) + \frac{\delta}{\delta y}\left(\frac{1}{(\rho_y(x,y)}\frac{\delta V(x,y)}{\delta x}\right) = J'_{mp}(x,y) \quad (13)$$

wherein the current density vector is given by:

$$\vec{j}(x,y) = \begin{pmatrix} \frac{1}{\rho_x(x,y)} \frac{\delta V(x,y)}{\delta x} \\ \frac{1}{\rho_y(x,y)} \frac{\delta V(x,y)}{\delta y} \end{pmatrix} \quad (14)$$

The best conductivity in a random direction can then be modelled by including the second mixed derived term $$\frac{\delta}{\delta x}\left(\frac{1}{\rho_{xy}(x,y)}\frac{\delta V(x,y)}{\delta y}\right)$$

in the calculation. In this way the anisotropic conductivity is used to analyze other metallization patterns with fingers extending in random directions, by bringing the anisotropic conductivity into line with the fingers.

The tab ($y \geq y_0$) has a surface conductivity $\sigma_r$. For ($y<y_0$) the conductivity $\sigma_x$ is set to zero in x-direction and $$\rho_y = \frac{s}{W}\rho_{sm,0}$$

applies.

In this case the conductivity of the metallization pattern is determined by only one parameter, the finger distance s, which is found by optimizing the power produced by the cell.

Figure 3:
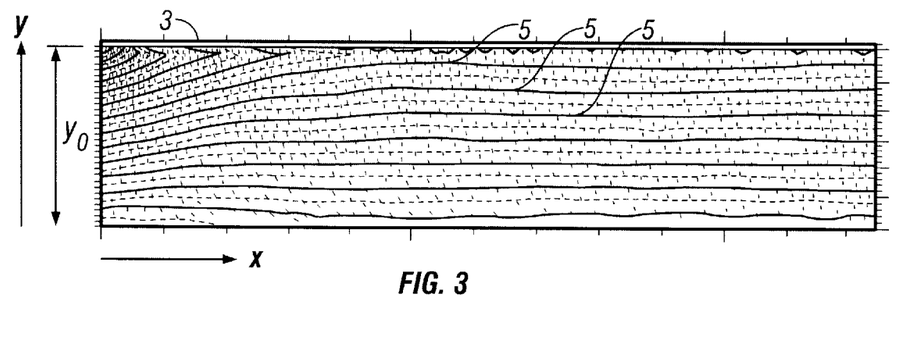
FIG. 3 shows in top view a detail of the surface of the solar cell of FIG. 2, in which are drawn calculated normalized current density vectors and contour lines representing the calculated percentage of coverage by the metallization lines.

FIG. 3 shows the lower part of the surface of solar cell 10 of FIG. 2, which for the purpose of the calculations is deemed a unit cell, in which are drawn calculated normalized current density vectors $\vec{j}(x,y)/|j(x,y)|$ and contour lines 5 representing the calculated percentage of coverage by the metallization lines.

Comparison of FIG. 1 and FIG. 2 and 3 teaches that the optimized metallization pattern in solar cell 10 differs only slightly from the H-shaped metallization pattern with non-tapering fingers in solar cell 1 of FIG. 1. In the optimized cell the direction of the current is also substantially perpendicular to that of the tabs 3. The resistance of tabs 3 is low compared to that of the metallization, so that resistance losses in the metallization are minimal when the current flows along the shortest route to tabs 3. In the optimized unit cell the metallization is shifted slightly in the direction of the edge of the unit cell to the region close to tab 3.

Figure 4:
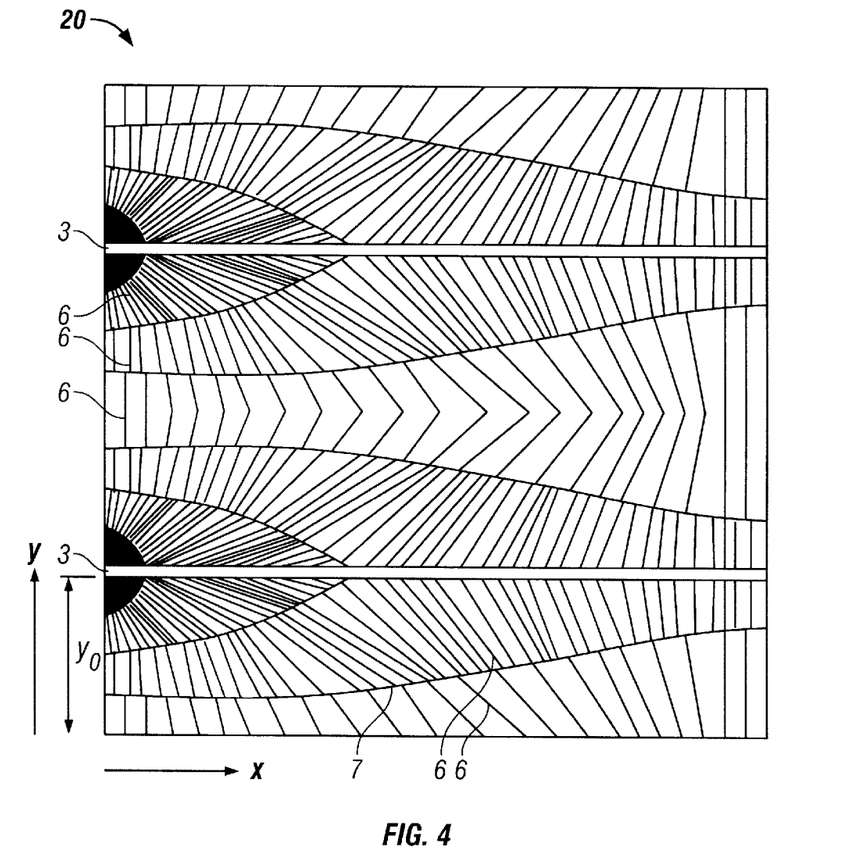
FIG. 4 shows in bottom view a square solar cell provided with a metallization mesh which is obtained according to a second embodiment of the method according to the invention by optimizing a metallization mesh covering the entire rear side of the solar cell.

FIG. 4 shows the rear side of a solar cell 20 provided with a metallization mesh 6, 7 which is obtained according to the invention by starting when optimizing from a metallization mesh which covers the entire rear side of the solar cell. The density of fingers 6 increases in the direction of the current take-off points on the left-hand side. For the mutual contact of fingers in regions of different density use is made of connecting strips 7 extending along paths with equivalent potential. By way of alternative, it is possible to choose a pattern with a branching structure, according to which structure the fingers 4 do not extend fully parallel to the pattern with maximum current densities. The shown pattern results in a coverage by the metallization of 24% of the rear side of the solar cell, corresponding to a value $F_c=0.03$ for the dimensionless parameter in equation (9).

Figure 5:
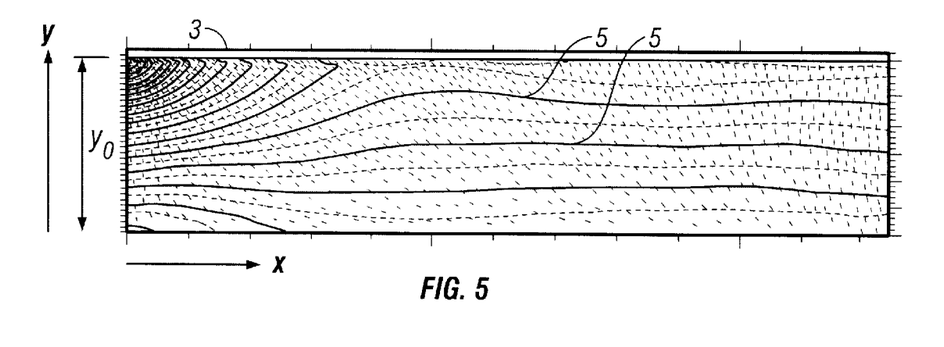
FIG. 5 shows in bottom view the surface of the solar cell of FIG. 4, in which are drawn calculated normalized current density vectors and contour lines representing the calculated percentage of coverage by the metallization lines.

FIG. 5 shows the lower part of the surface of solar cell 20 of FIG. 4, in which are drawn calculated normalized current density vectors $\vec{j}(x,y)/|j(x,y)|$ and contour lines 5 representing the calculated percentage of coverage by the metallization lines.

Figure 6:
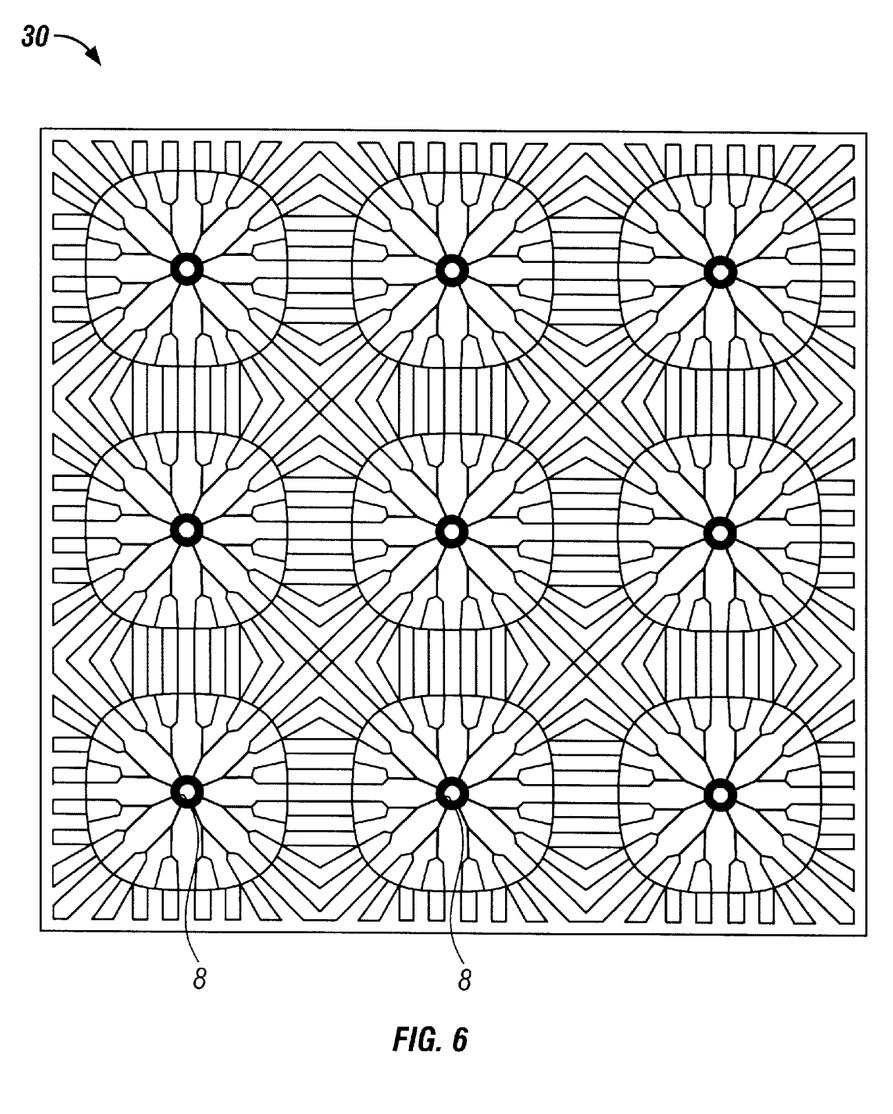
FIG. 6 shows in top view a first embodiment of a square solar cell of the MRT ('metallization wrap through') type, provided with a metallization mesh as shown in FIG. 7 and obtained according to a third embodiment of the method according to the invention by starting when optimizing from a metallization mesh covering the whole top or front side of the solar cell.

FIG. 6 shows the front side, adapted to receive incident sunlight, of a square solar cell 30 of 12.5×12.5 cm² of the MRT ('metallization wrap through') type with nine holes 8 with a diameter of 2 mm. In an MRT solar cell the negative and positive contacts are both situated on the rear side of the cell, in order to reduce shadow losses on the front side, wherein use is made of passages in the solar cell surface for through-feed of conductors. The shown solar cell 30 can be subdivided into nine identical square physical unit cells, which can each be subdivided into eight mathematical unit cells.

Figure 7:
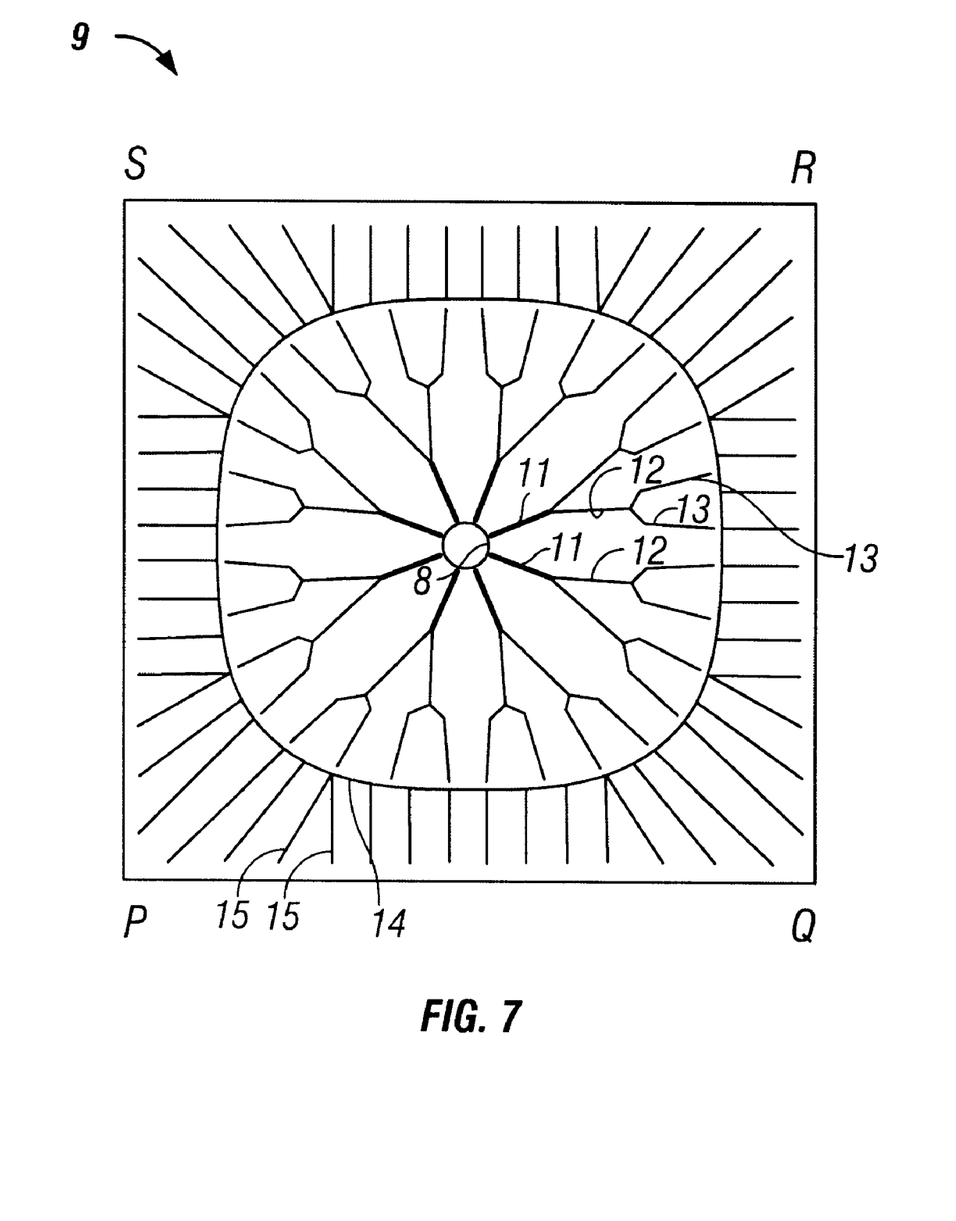
FIG. 7 shows a top view of a detail of the solar cell shown in FIG. 6 with the metallization mesh.
Figure 8:
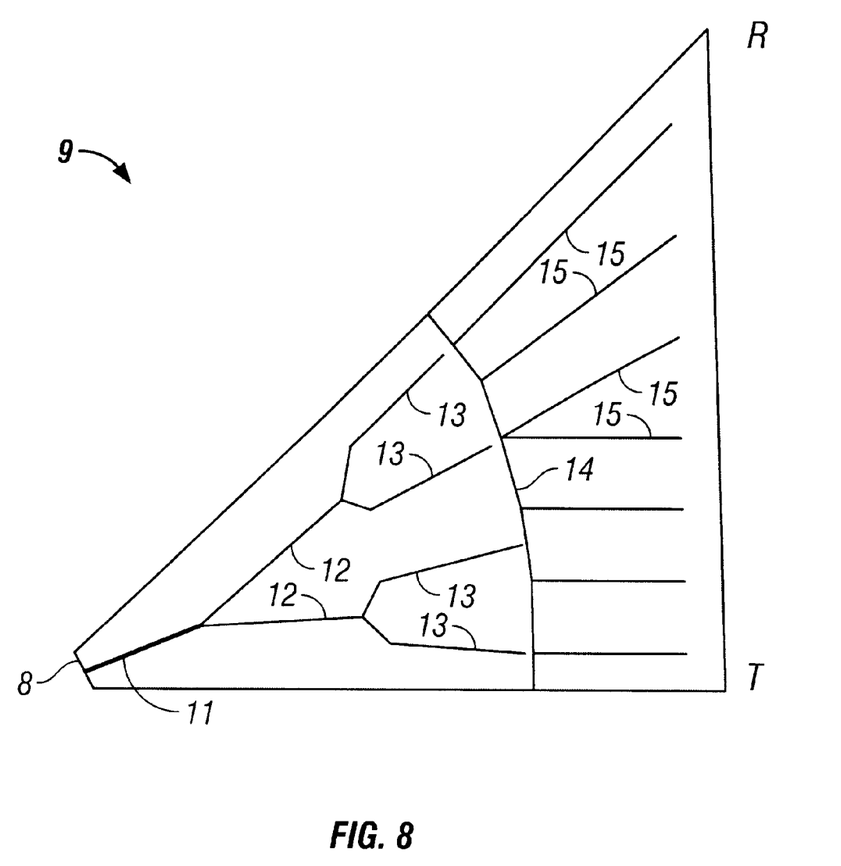
FIG. 8 shows in top view a further enlarged detail of the solar cell shown in FIG. 6 with the metallization mesh.
Figure 9:
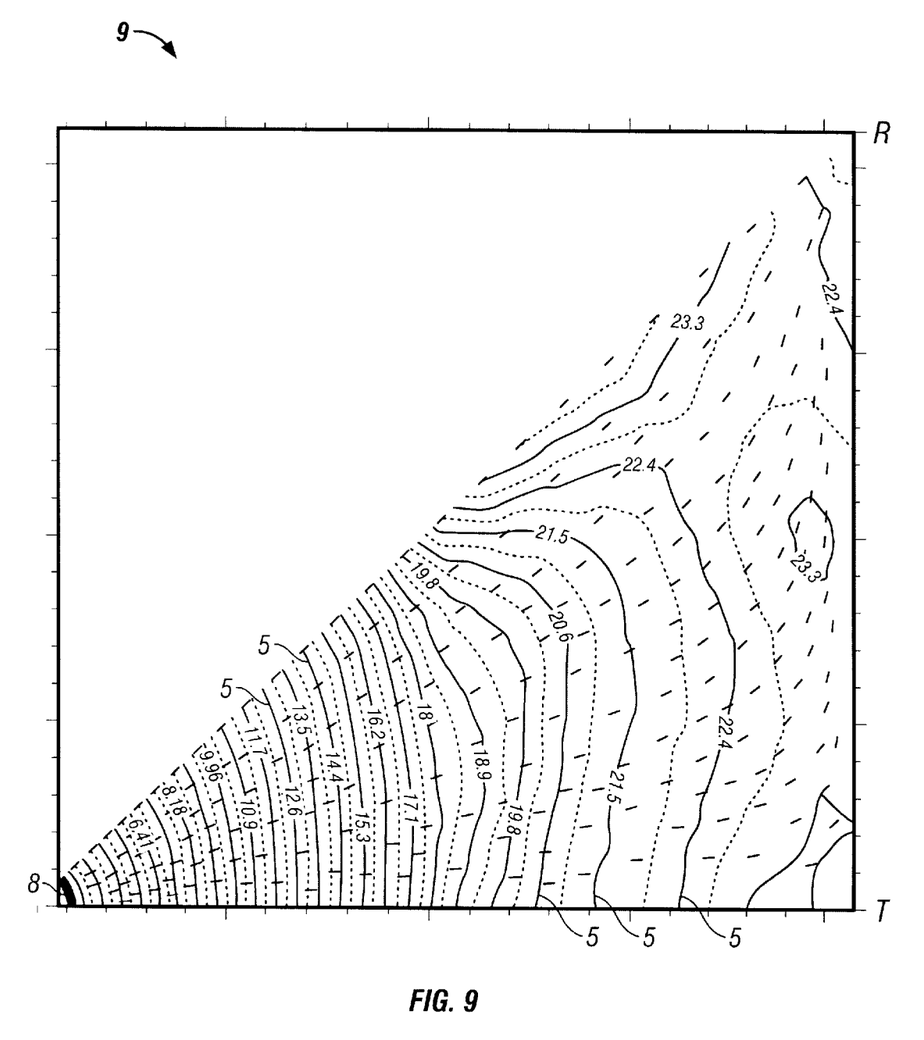
FIG. 9 shows in top view a detail of the surface of the solar cell of FIG. 6, in which are drawn calculated normalized current density vectors and contour lines representing the calculated percentage of coverage by the metallization lines.

FIG. 7 shows in detail a physical unit cell PQRS of MRT solar cell 30 of FIG. 6 with a metallization pattern 11, 12, 13, 14, 15 obtained according to a method wherein it was deemed a full metallization of varying thickness. The average shadow fraction or light-emitting transmitting metallization of the pattern consists of a linear combination of the analytic function $\mu/r$ and an interpolant which is based on six points of the mathematical unit cell 9, which is shown in FIGS. 8 and 9. In the function $\mu/r$, r is the distance from the center of hole 8 to a point on the unit cell PQRS and $\mu$ is a scalar quantity, the value of which is determined by fittings. The width of the fingers decreases at each branching in the direction from hole 8 toward the edges of the unit cell PQRS: in the example the drawn fingers 11, 12, 13 have a line width of respectively 300, 150 and 100 $\mu$m.

FIG. 8 shows in detail a mathematical unit cell 9 of the MRT solar cell 30 of FIG. 6, corresponding with the sector of FIG. 9 which is bounded by the periphery of hole 8, the point T in the centre of the line segment QR and the point R.

FIG. 9 shows the surface of the mathematical unit cell 9 of solar cell 30 of FIG. 6, in which are drawn calculated normalized current density vectors $\vec{j}(x,y)/|j(x,y)|$ and contour lines 5 representing the calculated percentage of coverage by the metallization lines. The figure shows that the shadow fraction increases markedly close to a hole 8. Emitter and contact resistances are dominant in the part of unit cell 9 furthest removed from hole 8, which results in a constant value for the shadow fraction of about 5%. The more holes a solar cell comprises per unit of area, the lower the contribution of line resistance becomes. Because losses resulting from emitter and contact resistances are constant, they will begin to dominate as the number of holes increases further so that the number of holes per unit area has an upper limit which, in the case of the present solar cell with a surface area of 12.5×12.5 cm² amounts to about 25.

Figure 10:
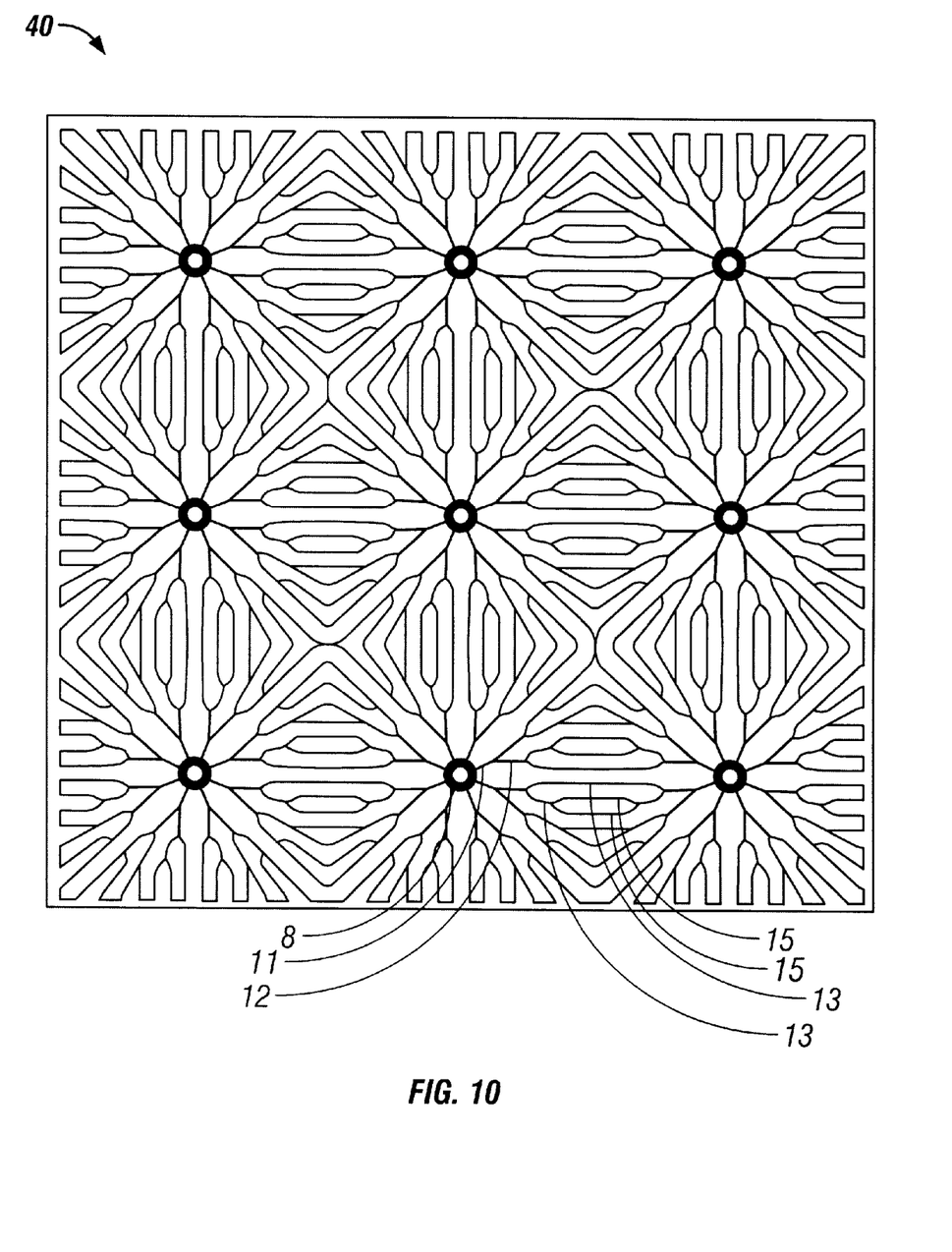
FIG. 10 shows in top view a second embodiment of a square solar cell of the MRT ('metallization wrap through') type, provided with a metallization mesh which according to a third embodiment of the method according to the invention is obtained by starting when optimizing from a metallization mesh covering the whole top or front side of the solar cell.

FIG. 10 shows the front side, adapted to receive incident sunlight, of a square solar cell 40 of the MRT type, which is an alternative embodiment of the solar cell 30 shown in FIG. 6. In solar cell 30 a connection between fingers 13 and 15 at different mutual distance is made using continuous lines 14 closed in peripheral direction. In solar cell 40 the fingers 13, 15 are branched per physical unit cell in a manner such that they lie in line with corresponding fingers in an adjacent unit cell, and the lines 14 closed in peripheral direction are omitted.

It is noted that above embodiments serve to elucidate the invention, which can in principle be applied in optimizing a metallization pattern on any type of solar cell, wherein it is not required to specify the direction of the current in this solar cell or the topology of the metallization. With the method according to the invention the metallization pattern can for instance be optimized for a maximum efficiency at a determined level of incident sunlight, for a maximum annual energy yield, or for an optimal balance between the cost of a metallization pattern and the electrical resistance of that pattern.

What is claimed is:

1. Method for applying a metallization in accordance with a pattern of a system of mutually connected electrical conductors for transporting electrical charge carriers on at least one of the outer surfaces of a photovoltaic element, wherein the conductors display a series resistance and cover a part of the at least one outer surface in accordance with a degree of covering and cause shadow and resistance losses, which method comprises the steps of:

(i) providing said photovoltaic element, at least one of the outer surfaces of which is a front surface of the photovoltaic element adapted to receive incident light, the front surface being adapted for applying of a metallization thereto, and (ii) applying a metallization in accordance with a pattern on the front surface, characterized in that the metallization is applied in the second step (ii) in accordance with an optimized pattern which is obtained by determining the thickness $d(x,y)$ as a function of the location $(x,y)$ on said front surface of a light-transmitting metallization layer which completely covers said front surface and allows through a fraction of a quantity of incident light corresponding with said degree of covering, in a manner such that the sum $(P_m+P_s)$ is minimal, in which $P_m$ represents the resistance losses $$P_m = \int_S \frac{1}{\rho_{sm}(x,y)} (\vec{\nabla} V(x,y))^2 dxdy$$

and $P_s$ represents either shadow losses $$P_s = \int_S P_s(x,y) J_{mp} V_{mp} dxdy$$

or an efficiency loss $$\int_S P_s(x,y) J_{mp} V_{mp} F_c dxdy$$

for the quantity of material for the metallization, which would occur in the photovoltaic element in operative state, and by deriving from the thickness $d(x,y)$ as a function of the location $(x,y)$ the geometry of a pattern of a system of mutually connected electrical conductors, in which equations S is the surface of the photovoltaic element, $P_s(x,y)$ represents a shadow fraction, $J_{mp}$ and $V_{mp}$ respectively represent the local current density and the voltage at the maximum power generated by the element, $\rho_{sm}(x,y)$ represents the surface resistance, $V(x,y)$ represents a voltage distribution and $F_c$ is a dimensionless parameter which relates the quantity of material for the metallization to an efficiency loss.

2. Method as claimed in claim 1, characterized in that the thickness $d(x,y)$ as a function of the location $(x,y)$ of the metallization is determined for a case in which the metallization which would completely cover the front surface has an isotropic electrical conductivity.

3. Method as claimed in claim 1, characterized in that the optimized pattern is obtained by determining the thickness $d(x,y)$ of said light-transmitting metallization layer as a function of the location $(x,y)$ on the front surface, in a manner such that the electrical power of the photovoltaic element is also maximal as a function of the electrical resistance $\rho_{ce}(x,y)$ in the transition between the surface of the photovoltaic element and the metallization.

4. Method as claimed in claim 1, characterized in that the optimized pattern is obtained by determining the thickness $d(x,y)$ of said light-transmitting metallization layer as a function of the location $(x,y)$ on the front surface, in a manner such that the electrical power of the photovoltaic element is also maximal as a function of the surface resistance $\rho_e(x,y)$ of the photovoltaic element.

5. Method as claimed in claim 1, characterized in that the optimized pattern is obtained by determining the thickness of said light-transmitting metallization layer as a function of the location $(x,y)$ on the front surface, in a manner such that the electrical power of the photovoltaic element is also maximal as a function of the resistivity $\rho_{sm,0}$ of the material of the metallization.

6. Photovoltaic element (10, 20, 30, 40) provided with a metallization applied according to the method as claimed in any of the claims 1–5.

* * * * *